(12) United States Patent
Malone et al.

(10) Patent No.: US 10,879,291 B2
(45) Date of Patent: Dec. 29, 2020

(54) STACKED SENSOR WITH INTEGRATED CAPACITORS

(71) Applicant: RAYTHEON COMPANY, Waltham, MA (US)

(72) Inventors: Neil R. Malone, Goleta, CA (US); Sean P. Kilcoyne, Lompoc, CA (US); Micky Harris, Lompoc, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 16/201,633

(22) Filed: Nov. 27, 2018

(65) Prior Publication Data
US 2020/0168651 A1 May 28, 2020

(51) Int. Cl.
*H01L 27/146* (2006.01)
*H04N 5/33* (2006.01)
*H01L 31/18* (2006.01)

(52) U.S. Cl.
CPC .... *H01L 27/14634* (2013.01); *H01L 27/1469* (2013.01); *H01L 27/14636* (2013.01)

(58) Field of Classification Search
CPC ......... H01L 27/14634; H01L 27/14636; H01L 27/14643; H01L 27/1465; H01L 27/14678; H01L 27/14683; H01L 27/14787; H01L 27/1469–14698; H01L 27/14806; H01L 27/281; H01L 27/30; H01L 27/307; H01L 28/40; H01L 28/60; H01L 28/90; H01L 23/04–043; H01L 23/053; H01L 23/12; H01L 23/13; H01L 23/481; H01L 23/482; H01L 23/485; H01L 23/4855; H01L 23/49816; H01L 23/5329; H01L 24/02; H01L 24/04–17; H01L 24/18–25; H01L 23/5226; H01L 23/528; H01L 23/535; H01L 23/5381; H01L 23/5385; H01L 25/04; H01L 25/043; H01L 25/065; H01L 25/0657; H01L 25/073; H01L 25/074; H01L 25/0756; H01L 25/10; H01L 25/112; H01L 25/117; H01L 25/162; H01L 25/165; H01L 25/50; H01L 2924/1461; H03H 2015/005; H04N 5/374; H04N 5/378; H04N 5/369; G06K 9/46
USPC ............................ 257/428, 723, 777; 438/34
See application file for complete search history.

(56) References Cited

U.S. PATENT DOCUMENTS

| 6,841,883 | B1 | 1/2005 | Farnworth et al. | |
|---|---|---|---|---|
| 7,626,460 | B2 * | 12/2009 | Liu | H03F 3/082 330/300 |
| 9,123,607 | B1 | 9/2015 | Hatcher et al. | |
| 9,991,218 | B2 * | 6/2018 | Tu | H01L 23/3114 |
| 10,057,521 | B1 | 8/2018 | Sanchez et al. | |

(Continued)

OTHER PUBLICATIONS

International Search Report and Written Opinion Application No. PCT/US2019/057752; dated Jan. 30, 2020; pp. 15.

*Primary Examiner* — Natalia A Gondarenko
(74) *Attorney, Agent, or Firm* — Cantor Colburn LLP

(57) ABSTRACT

A three-dimensional (3D) stack is provided and includes a capacitor layer and an integrated circuit (IC) layer. The capacitor layer includes capacitors and capacitor layer connectors respectively communicative with corresponding capacitors. The IC layer is stacked vertically with the capacitor layer and is hybridized to a detector. The IC layer includes IC layer connectors respectively communicative with corresponding capacitor layer connectors.

19 Claims, 3 Drawing Sheets

(56) References Cited

U.S. PATENT DOCUMENTS

| | | |
|---|---|---|
| 2010/0019128 A1 | 1/2010 | Itzler |
| 2012/0153122 A1* | 6/2012 | DeNatale .......... H01L 27/14665 |
| | | 250/208.1 |
| 2015/0115386 A1* | 4/2015 | Chuang ............. H01L 27/14634 |
| | | 257/443 |
| 2015/0118784 A1* | 4/2015 | Gerber ................ H01L 27/1469 |
| | | 438/67 |
| 2015/0163425 A1* | 6/2015 | Oganesian ......... H04N 5/37455 |
| | | 348/302 |
| 2015/0613401 | 6/2015 | Botts et al. |
| 2017/0301749 A1* | 10/2017 | Briggs ................ H01L 23/5223 |

\* cited by examiner

STACKED SENSOR WITH INTEGRATED CAPACITORS

BACKGROUND

The present disclosure relates to focal plane array (FPA) modules and, more particularly, to a three-dimensionally (3D) stacked sensor with integrated capacitors for use in an FPA module.

An FPA module typically includes a Read Out Integrated Circuit (ROIC) and a detector hybridized to the ROIC to make a Sensor Chip Assembly (SCA). The SCA is mounted onto a pedestal. A motherboard with cabling and capacitors is also mounted to the pedestal and surrounds the SCA. The SCA is electrically connected to the motherboard by wire bonds.

In greater detail, the FPA module can include a relatively thick substrate with an upper surface and a recess formed in a central region of the upper surface. The recess can be characterized with a bottom surface and sidewalls extending vertically upwardly from the bottom surface to the upper surface. An integrated circuit (IC) layer sits on the bottom surface within the recess and has an upper IC layer surface disposed above the upper surface of the substrate. Sidewalls of the IC layer are displaced from the sidewalls of the recess such that a width of the recess exceeds a width of the IC layer. A detector layer is disposed above the IC layer and is communicative with the IC layer by way of connectors arrayed on the lower surface of the IC layer and corresponding connectors arrayed on the upper surface of the IC layer. Capacitors to support operations of the IC layer are operably disposed on the upper surface of the substrate outside of the recess and are connected to the IC layer by wire bonds extending curvi-linearly from the capacitors, across the space between the sidewalls of the recess and the sidewalls of the IC layer and to the IC layer.

The capacitors are typically long-lead capacitors and can be expensive. They are also typically installed by hand and the wire bonds are susceptible to damage caused by handling. In order to provide space for the capacitors, a size of the substrate must be increased and an overall size of the FPA module is correspondingly increased. This results in a physically large overall size and a substantially increased heat load module. In addition, in some cases, additional capacitors are installed in FPA modules to compensate for capacitor wire bond inductance. These additional capacitors can exacerbate the issues laid out herein.

SUMMARY

According to one embodiment, a three-dimensional (3D) stack is provided and includes a capacitor layer and an integrated circuit (IC) layer. The capacitor layer includes capacitors and capacitor layer connectors respectively communicative with corresponding capacitors. The IC layer is stacked vertically with the capacitor layer and is hybridized to a detector. The IC layer includes IC layer connectors respectively communicative with corresponding capacitor layer connectors.

According to another embodiment, a three-dimensionally (3D) stacked sensor is provided and includes a detector layer, a capacitor layer and an integrated circuit (IC) layer. The detector layer includes a first upper surface receptive of electro-magnetic (EM) signals, a first lower surface and first connectors arrayed along the first lower surface. The capacitor layer includes a second upper surface, capacitors suspended within the capacitor layer and second connectors respectively communicative with corresponding capacitors and arrayed along the second upper surface. The IC layer includes a third upper surface, a second lower surface, third connectors respectively communicative with corresponding first connectors and arrayed along the third upper surface and fourth connectors respectively communicative with corresponding second connectors and arrayed along the second lower surface.

According to another embodiment, a three-dimensionally (3D) stacked focal plane array (FPA) module is provided and includes a detector layer, a capacitor layer and an integrated circuit (IC) layer. The detector layer includes a detector array and the capacitor layer includes capacitors. The IC layer is stacked vertically between the capacitor layer and the detector layer. Each of the detector layer and the IC layer is hybridized to one another to enable communication between the detector array and the IC layer. Each of the capacitor layer and the IC layer is hybridized to one another to enable communication between the capacitors and the IC layer.

According to yet another embodiment, a method of assembling a three-dimensionally (3D) stacked focal plane array (FPA) module is provided. The method includes forming a detector layer that includes a detector array, forming a capacitor layer that includes capacitors and vertically stacking an integrated circuit (IC) layer between the capacitor layer and the detector layer. The method further includes hybridizing each of the detector layer and the IC layer to one another to enable communication between the detector array and the IC layer and hybridizing each of the capacitor layer and the IC layer to one another to enable communication between the capacitors and the IC layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
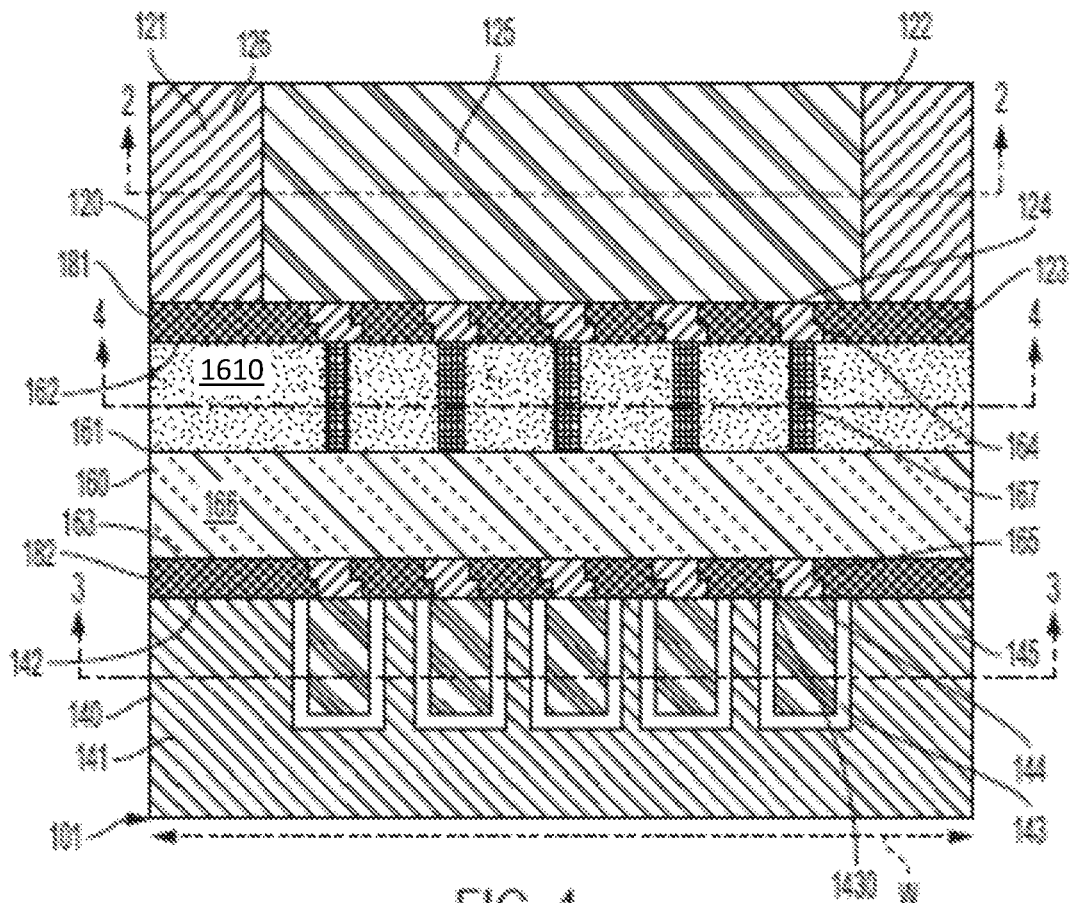
FIG. 1 is a side view of a three-dimensionally stacked sensor in accordance with embodiments.

As will be described below, a three-dimensionally (3D) stacked read-out integrated circuit (IC) (ROIC) wafer is provided with a bypass capacitor wafer layer. The 3D stacked ROIC wafer includes commercial off the shelf capacitors and requires no capacitor procurement. In addition, the 3D stacked ROIC wafer has a structure which does not include wire bonding and does not exhibit capacitor interference with its detection window. The 3D stacked wafer provides for improved reliability and improved signal quality.

With reference to FIGS. 1-4, a 3D stacked sensor 101 is provided and is configured as an FPA module with a reduced size, thermal weight and footprint. The 3D stacked sensor 101 includes a detector layer 120, a capacitor layer 140 and an IC layer 160. The IC layer 160 is vertically stacked between the detector layer 120 and the capacitor layer 140. As will be described below, a lower surface of the detector layer 120 and an upper surface of the IC layer 160 are each hybridized to one another and an upper surface of the capacitor layer 140 and a lower surface of the IC layer 160 are each hybridized to one another. As such, the detector layer 120 is communicative with the IC layer 160 and the capacitor layer 140 is communicative with the IC layer 160. The 3D stacked sensor 101 can further include a first layer of one or more adhesives 181, which is vertically interposed between the detector layer 120 and the IC layer 160, and a second layer of one or more adhesives 182, which is vertically interposed between the IC layer 160 and the capacitor layer 140.

Figure 2:
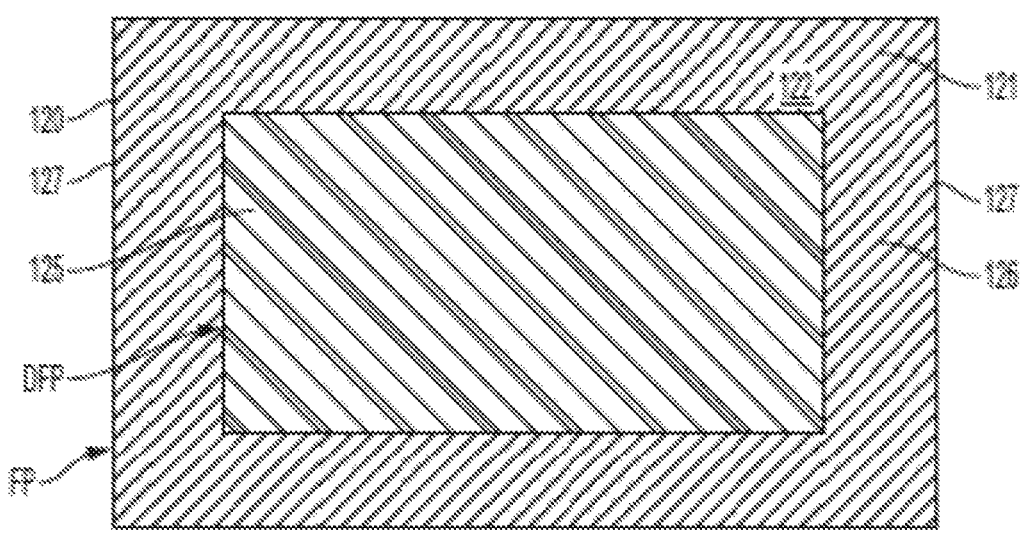
FIG. 2 is a cross-sectional view of components of a detector layer of the three-dimensionally stacked sensor of FIG. 1 taken along line 2-2 of FIG. 1.

As shown in FIGS. 1 and 2, the detector 120 includes a detector body 121, a first upper (major) surface 122 that is receptive of incident electro-magnetic (EM) signals, a first lower (major) surface 123 opposite the first upper surface 122 and first connectors 124. The detector layer 120 can be provided as a detector array with an array of detector elements 125 suspended within a support element 126 that can be formed of dielectric material for example. The first connectors 124, which can be provided as an array of connectors or pads, are arrayed along the first lower surface 123.

Figure 3:
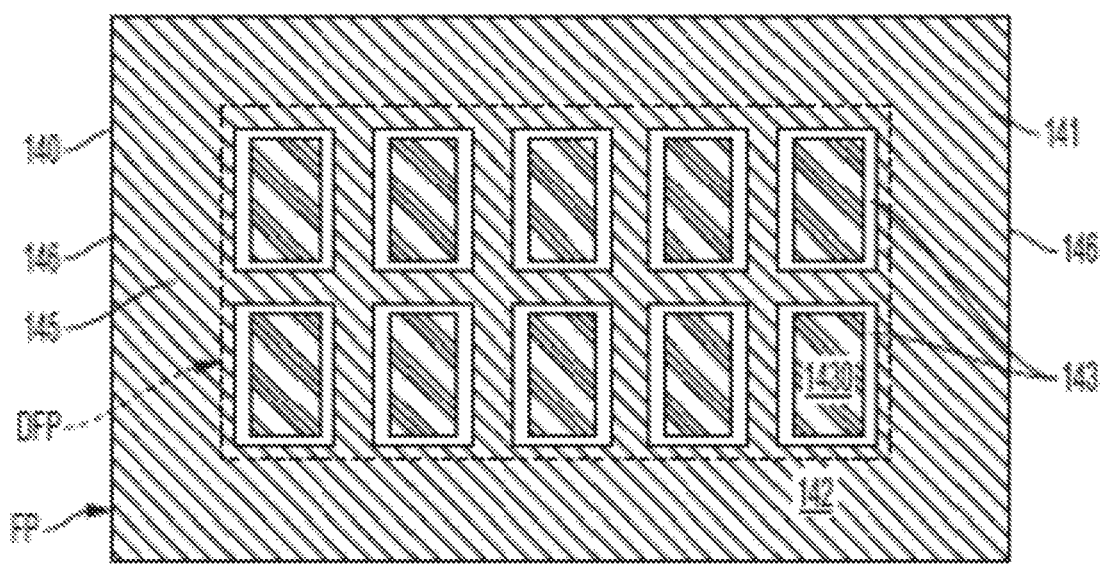
FIG. 3 is a cross-sectional view of components of a capacitor layer of the three-dimensionally stacked sensor of FIG. 1 taken along line 3-3 of FIG. 1.

As shown in FIGS. 1 and 3, the capacitor layer 140 includes a capacitor layer body 141, a second upper (major) surface 142, capacitors 143 and second connectors 144. The capacitors 143 are suspended within a support structure 145 of the capacitor layer body 141, which can be formed of dielectric material for example. The second connectors 144 can be provided as an array of connectors or pads, are respectively communicative with corresponding capacitors 143 and are arrayed along the second upper surface 142.

The capacitors 143 can be provided as commercial off the shelf (COTS) capacitors. In any case, an upper surface 1430 of each of the capacitors 143 can be substantially coplanar with the second upper surface 142. In some cases, each of the capacitors 143 is substantially a same size and shape as all of the other capacitors 143.

Figure 4:
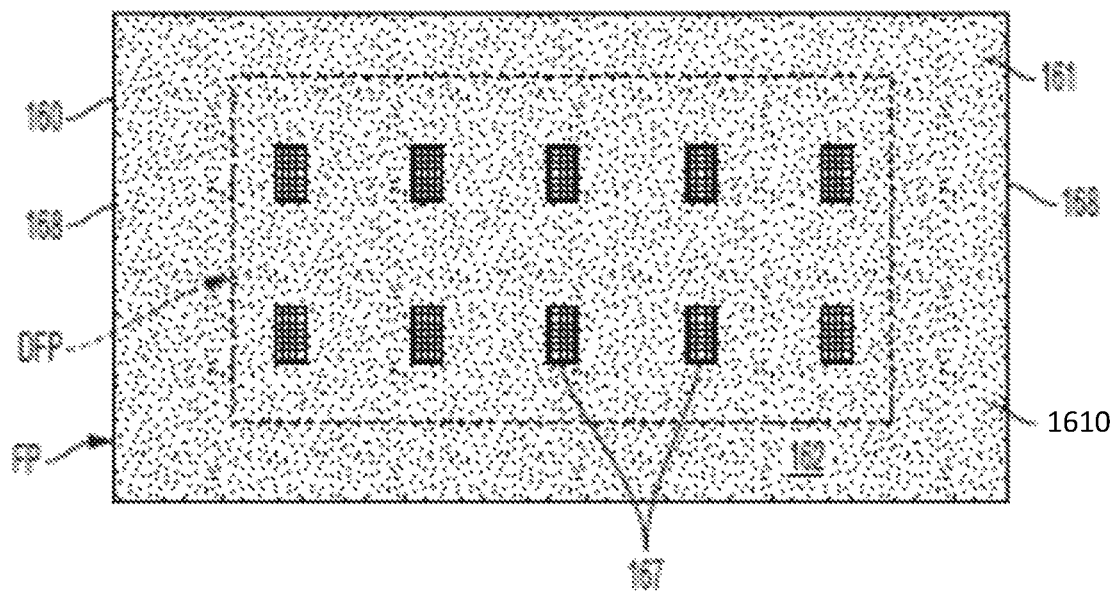
FIG. 4 is a cross-sectional view of components of an integrated circuit layer of the three-dimensionally stacked sensor of FIG. 1 taken along line 4-4 of FIG. 1.

As shown in FIGS. 1 and 4, the IC layer 160 includes an IC layer body 161, a third upper (major) surface 162, a second lower (major) surface 163, third connectors 164 and fourth connectors 165. The third connectors 164 can be provided as an array of connectors or pads, are respectively communicative with corresponding first connectors 124 within the first layer of adhesive 181 and are arrayed along the third upper surface 162. The fourth connectors 165 can be provided as an array of connectors or pads, are respectively communicative with corresponding second connectors 144 within the second layer of adhesive 182 and are arrayed along the second lower surface 163.

In accordance with embodiments, the IC layer body 161 can include a dielectric layer 1610, which can be formed of dielectric material, a ROIC 166 that is disposed underneath the dielectric layer 1610 and extends along the second lower surface 163 and contact vias 167. The contact vias 167 extend from the second lower surface 163 to the third upper surface 162 through the ROIC 166 and the dielectric layer 1610 and are respectively communicative with corresponding third connectors 164 and fourth connectors 165.

The detector layer 120, the capacitor layer 140 and the IC layer 160 are stacked vertically with the IC layer vertically interposed between the detector layer 120 and the capacitor layer 140. In some cases, the detector layer 120 can include detector layer sidewalls 127 (see FIG. 2), the capacitor layer 140 can include capacitor layer sidewalls 146 (see FIG. 3) and the IC layer 160 can include IC layer sidewalls 168 (see FIG. 4) with the detector layer sidewalls 127, the capacitor layer sidewalls 146 and the IC layer sidewalls 168 being substantially coplanar with one another. In some cases, a footprint FP (see FIGS. 2, 3 and 4) or a width W (see FIG. 1) of each of the detector layer 120, the capacitor layer 140 and the IC layer 160 is substantially common to the detector layer 120, the capacitor layer 140 and the IC layer 160.

As shown in FIGS. 2, 3 and 4, to the extent that the detector layer 120 includes an array of detector elements 125, the array of detector elements 125 can be arranged in a formation with a detector footprint DFP. The detector footprint DFP can be smaller in one or more dimensions than the footprint FP. In addition, the capacitors 143 of the capacitor layer 140 and the contact vias 167 of the IC layer 160 can be arranged in respective formations that are encompassed within the detector footprint DFP.

In accordance with embodiments and as shown in FIG. 1, connector-component and connector-connector connections do not require perfect alignments. That is, the second connectors 144 are respectively communicative with and aligned or partially misaligned relative to the corresponding capacitors 143, the third connectors 164 are respectively communicative with and aligned or partially misaligned relative to the corresponding first connectors 124 and corresponding contact vias 167 and the fourth connectors 165 are respectively communicative with and aligned or partially misaligned relative to corresponding second connectors 144.

Figure 5:
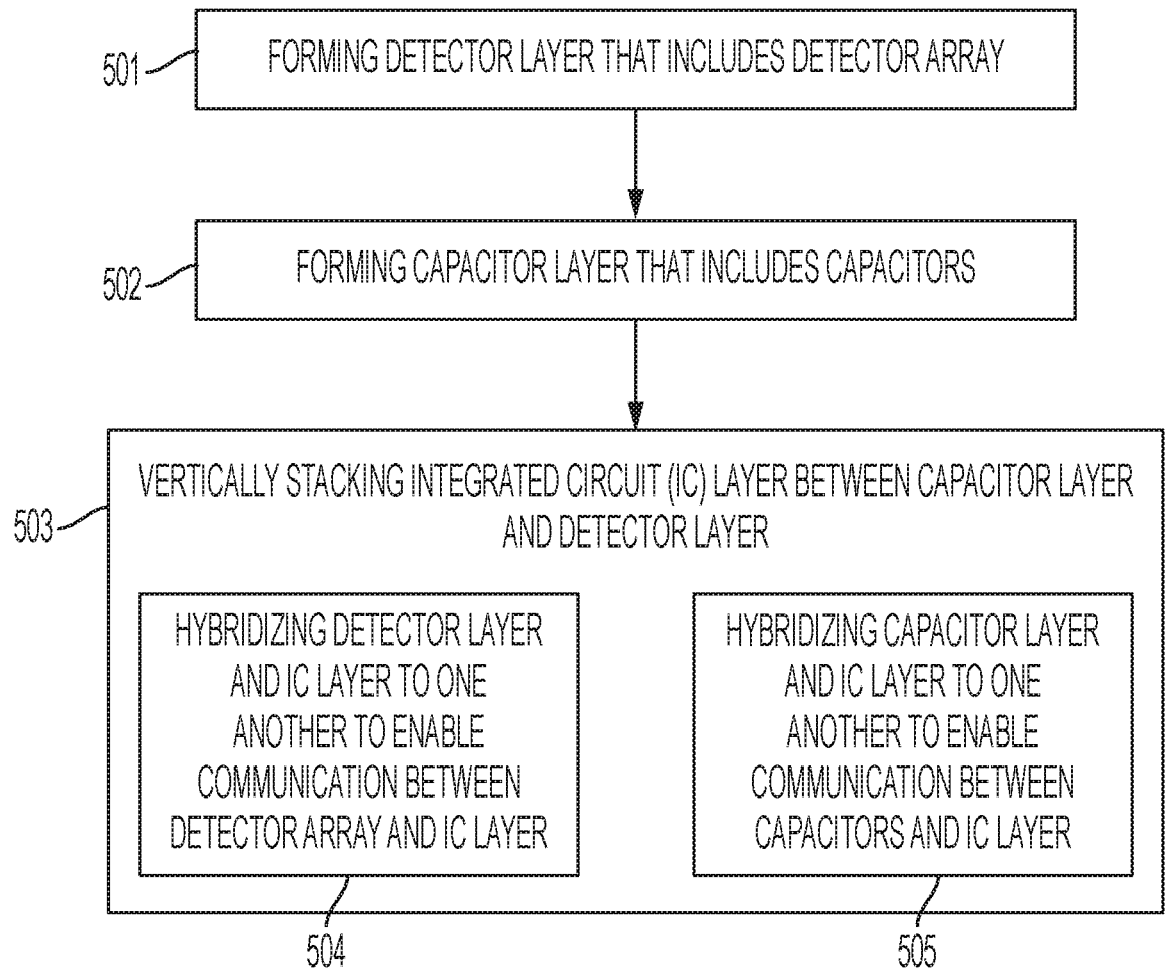
FIG. 5 is a flow diagram illustrating a method of assembling a three-dimensionally (3D) stacked focal plane array (FPA) module.

In accordance with further embodiments and with reference to FIG. 5, a method of assembling a three-dimensionally (3D) stacked focal plane array (FPA) module is provided. The method includes forming a detector layer that includes a detector array (501), forming a capacitor layer that includes capacitors (502) and vertically stacking an integrated circuit (IC) layer between the capacitor layer and the detector layer (503). The method further includes hybridizing each of the detector layer and the IC layer to one another to enable communication between the detector array and the IC layer (504) and hybridizing each of the capacitor layer and the IC layer to one another to enable communication between the capacitors and the IC layer (505).

Technical effects and benefits of the present invention are the lowered overall cost of an FPA design, a lowered schedule time for an FPA design, increased reliability and yield. In addition, the present invention does not require procurement of discrete capacitors and eliminates the need for touch-labor in the connection between wire bonds and capacitors.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A three-dimensional (3D) stack, comprising:
   a detector layer comprising a detector array having a detector footprint;
   a capacitor layer comprising capacitors encompassed within the detector footprint and capacitor layer connectors respectively communicative with corresponding capacitors; and
   an integrated circuit (IC) layer stacked vertically with the detector layer above the IC layer and the capacitor layer below the IC layer, the IC layer being hybridized to the detector layer,
   wherein:
   the IC layer comprises IC layer connectors respectively communicative with corresponding capacitor layer connectors, and
   corresponding ones of the capacitor layer connectors, the capacitors and the IC layer connectors are aligned vertically.

2. The 3D stack according to claim 1, wherein the capacitor layer and the IC layer respectively comprise coplanar sidewalls.

3. The 3D stack according to claim 1, wherein:
   the capacitor layer comprises a support structure comprising dielectric material in which the capacitors are suspended, and
   an uppermost surface of each of the capacitors is coplanar with an uppermost surface of the dielectric material of the support structure of the capacitor layer.

4. The 3D stack according to claim 1, wherein each of the capacitors has substantially a same size and shape as all other capacitors in the capacitor layer.

5. The 3D stack according to claim 1, wherein the IC layer comprises:
   a dielectric layer;
   a read-out IC (ROIC) extending along a lower surface of the IC layer; and
   contact vias extending from an upper surface of the ROIC and through the dielectric layer to be respectively communicative with the IC layer connectors and encompassed within the detector footprint.

6. The 3D stack according to claim 5, wherein:
   the capacitor layer connectors are respectively communicative with and partially misaligned relative to corresponding capacitors and the IC layer connectors are respectively communicative with and partially misaligned relative to corresponding capacitor layer connectors, and
   the corresponding ones of the capacitor layer connectors, the capacitors and the IC layer connectors are aligned vertically with the corresponding ones of the contact vias.

7. The 3D stack according to claim 1, further comprising one or more adhesives vertically interposed between the IC layer and the capacitor layer.

8. A three-dimensional (3D) stack, comprising:
   a detector layer comprising a first upper surface receptive of electro-magnetic (EM) signals, a first lower surface, first connectors arrayed along the first lower surface and a detector array having a detector footprint;
   a capacitor layer comprising a support structure comprising dielectric material having a second upper surface, capacitors suspended within the dielectric material of the support structure of the capacitor layer and encompassed within the detector footprint and second connectors respectively communicative with corresponding capacitors and arrayed along the second upper surface; and
   an integrated circuit (IC) layer hybridized to the detector layer and comprising a third upper surface, a second lower surface, third connectors respectively communicative with corresponding first connectors and arrayed along the third upper surface and fourth connectors respectively communicative with corresponding second connectors and arrayed along the second lower surface,
   wherein:
   the detector layer, the capacitor layer and the IC layer are stacked vertically with the detector layer above the IC layer and the capacitor layer below the IC layer, and
   corresponding ones of the capacitors and the first connectors, the second connectors, the third connectors and the fourth connectors are aligned vertically.

9. The 3D stack according to claim 8, wherein the detector layer, the capacitor layer and the IC layer respectively comprise coplanar sidewalls.

10. The 3D stack according to claim 8, wherein:
    an uppermost surface of each of the capacitors is coplanar with the second upper surface of the dielectric material of the support structure of the capacitor layer, and
    each of the capacitors has substantially a same size and shape as all the other capacitors in the capacitor layer.

11. The 3D stack according to claim 8, wherein the IC layer comprises:
    a dielectric layer;
    a read-out IC (ROIC) extending along the second lower surface; and
    contact vias extending from an upper surface of the ROIC and through the dielectric layer to be respectively communicative with corresponding third and fourth connectors and encompassed within the detector footprint.

12. The 3D stack according to claim 11, wherein:
    the second connectors are respectively communicative with and partially misaligned relative to corresponding capacitors, the third connectors are respectively communicative with and partially misaligned relative to corresponding first connectors and the fourth connectors are respectively communicative with and partially misaligned relative to corresponding second connectors, and
    the corresponding ones of the capacitors and the first connectors, the second connectors, the third connectors and the fourth connectors are aligned vertically with the corresponding ones of the contact vias.

13. The 3D stack according to claim 8, further comprising one or more adhesives vertically interposed between the detector layer and the IC layer and between the IC layer and the capacitor layer.

14. A three-dimensionally (3D) stacked focal plane array (FPA) module, comprising:
  a detector layer comprising a detector array having a detector footprint;
  a capacitor layer comprising capacitors encompassed within the detector footprint; and
  an integrated circuit (IC) layer comprising a read-out integrated circuit (ROIC) and contact vias extending upwardly from the ROIC, the IC layer being stacked vertically between the capacitor layer and the detector layer with the detector layer above the IC layer and the capacitor layer below the IC layer,
  each of the detector layer and the IC layer being hybridized to one another to enable communication between the detector array and the IC layer, and
  each of the capacitor layer and the IC layer being hybridized to one another to enable communication between the capacitors and the IC layer,
  wherein:
  the 3D stacked FPA module further comprises first sets of connectors by which the contact vias are respectively communicative with the detector array and second sets of connectors by which the capacitors are respectively communicative with the ROIC, and
  corresponding ones of the first connectors, the contact vias, the second connectors and the capacitors are aligned vertically.

15. The 3D stacked FPA module according to claim 14, wherein the detector layer, the capacitor layer and the IC layer respectively comprise coplanar sidewalls.

16. The 3D stacked FPA module according to claim 14, wherein:
  wherein the capacitor layer comprises a support structure comprising dielectric material in which the capacitors are suspended,
  an uppermost surface of each of the capacitors is coplanar with an uppermost surface of the dielectric material of the support structure of the capacitor layer, and
  each of the capacitors has substantially a same size and shape as all the other capacitors in the capacitor layer.

17. The 3D stacked FPA module according to claim 14, wherein the IC layer comprises:
  a dielectric layer;
  the read-out IC (ROIC), which extends along a lower surface of the IC layer; and
  the contact vias, which extend upwardly from the ROIC and through the dielectric layer to be respectively communicative with the detector layer and the capacitor layer and encompassed within the detector footprint.

18. A method of assembling a three-dimensionally (3D) stacked focal plane array (FPA) module, the method comprising:
  forming a detector layer comprising a detector array having a detector footprint;
  forming a capacitor layer comprising capacitors;
  vertically stacking an integrated circuit (IC) layer between the capacitor layer and the detector layer with the capacitors being encompassed within the detector footprint, the IC layer comprising a dielectric layer, a read-out IC (ROIC) extending along a lower surface of the IC layer and contact vias, which extend upwardly from the ROIC and through the dielectric layer to be respectively communicative with the detector layer,
  the method further comprising:
  hybridizing each of the detector layer and the IC layer to one another to enable communication between the detector array and the contact vias of the IC layer via first sets of connectors;
  hybridizing each of the capacitor layer and the IC layer to one another to enable communication between the capacitors and the ROIC of the IC layer via second sets of connectors; and
  vertically aligning corresponding ones of the contact vias, the first sets of the connectors, the second sets of the connectors and the capacitors.

19. The method according to claim 18, wherein the hybridizing comprises partially misaligned hybridizing.

* * * * *